United States Patent
Ye

(10) Patent No.: US 9,396,940 B2
(45) Date of Patent: Jul. 19, 2016

(54) THIN FILM SEMICONDUCTORS MADE THROUGH LOW TEMPERATURE PROCESS

(71) Applicant: Yan Ye, Saratoga, CA (US)

(72) Inventor: Yan Ye, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 66 days.

(21) Appl. No.: 14/366,210

(22) PCT Filed: Dec. 17, 2012

(86) PCT No.: PCT/US2012/070071
§ 371 (c)(1),
(2) Date: Jun. 17, 2014

(87) PCT Pub. No.: WO2013/106166
PCT Pub. Date: Jul. 18, 2013

(65) Prior Publication Data
US 2014/0363934 A1    Dec. 11, 2014

Related U.S. Application Data

(60) Provisional application No. 61/586,518, filed on Jan. 13, 2012.

(51) Int. Cl.
*H01L 21/00* (2006.01)
*H01L 21/02* (2006.01)
(Continued)

(52) U.S. Cl.
CPC ...... *H01L 21/02614* (2013.01); *H01L 21/0254* (2013.01); *H01L 21/02521* (2013.01);
(Continued)

(58) Field of Classification Search
CPC .............. H01L 21/0254; H01L 21/477; H01L 21/02612; H01L 29/7869; H01L 21/02565; H01L 21/02573
See application file for complete search history.

(56) References Cited

U.S. PATENT DOCUMENTS 5,397,720 A * 3/1995 Kwong et al. ................. 438/301
5,716,881 A   2/1998 Liang et al.
(Continued)

FOREIGN PATENT DOCUMENTS

JP        201129626        2/2010

OTHER PUBLICATIONS

Habraken et al., "Oxidation of silicon (oxy)nitride and nitridation of silicon dioxide: Manifestations of the same chemical reaction system?", Thin Solid Films, vols. 193-194, Part 2, Dec. 15, 1990, pp. 665-674 (abstract only).*
International Search Report and Written Opinion for PCT Application PCT/US2012/070071 dated Apr. 29, 2013, 12 pages.

*Primary Examiner* — Richard Booth
(74) *Attorney, Agent, or Firm* — Patterson & Sheridan, LLP

(57) ABSTRACT

Embodiments disclosed herein relate to a TFT and methods for manufacture thereof. Specifically, the embodiments herein relate to methods for forming a semiconductor layer at a low temperature for use in a TFT. The semiconductor layer may be formed by depositing a nitride or oxynitride layer, such as zinc nitride or oxynitride, and then converting the nitride layer into an oxynitride layer with a different oxygen content. The oxynitride layer is formed by exposing the deposited nitride layer to a wet atmosphere at a temperature between about 85 degrees Celsius and about 150 degrees Celsius. The exposure temperature is lower than the typical deposition temperature used for forming the oxynitride layer directly or annealing, which may be performed at temperatures of about 400 degrees Celsius.

17 Claims, 1 Drawing Sheet

(51) Int. Cl.
 H01L 29/786 (2006.01)
 H01L 21/477 (2006.01)
 H01L 29/66 (2006.01)

(52) U.S. Cl.
 CPC .... *H01L21/02554* (2013.01); *H01L 21/02565* (2013.01); *H01L 21/02573* (2013.01); *H01L 21/02581* (2013.01); *H01L 21/02612* (2013.01); *H01L 21/477* (2013.01); *H01L 29/66969* (2013.01); *H01L 29/7869* (2013.01)

(56) References Cited

U.S. PATENT DOCUMENTS

2003/0155582 A1   8/2003   Mahajani et al.
2010/0301343 A1   12/2010  Qiu et al.
2011/0278567 A1   11/2011  Ye

* cited by examiner

THIN FILM SEMICONDUCTORS MADE THROUGH LOW TEMPERATURE PROCESS

GOVERNMENT RIGHTS IN THIS INVENTION

This Invention was made with Government support under Agreement No. DAAD19-02-3-0001 awarded by ARL. The Government has certain rights in this Invention.

BACKGROUND OF THE INVENTION

1. Field of the Invention

Embodiments of the present invention generally relate to thin film transistors (TFT) and methods for fabrication thereof.

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs), such as organic light emitting diodes (OLEDs) for back lighting. The LEDs and OLEDs require TFTs for addressing the activity of the displays. The current driven through the TFTs (i.e., the on-current) is limited by the channel material (often referred to as the active material, semiconductor material or semiconductor active material) as well as the channel width and length. Additionally, the turn-on voltage is determined by the accumulation of the carrier in the channel area of the semiconductor layer which could change as the shift of the fixed charge in the semiconductor material or the charge trapping in interfaces and the threshold voltage shifts after bias temperature stress or current temperature stress.

The current practice in making the channel or semiconductor layer in a TFT is to deposit the semiconductor layer at a low temperature and then anneal the semiconductor layer at a higher temperature to increase the stability and mobility of the semiconductor layer. The annealing temperature is limited by the temperature that may be tolerated by the substrate. The performance of the TFT is limited by the deposition and annealing temperatures. The semiconductor layer may be deposited through a low temperature deposition process such as physical vapor deposition (PVD), chemical vapor deposition (CVD), sputtering, spin on processes, etc., but the semiconductor layer needs to either be annealed to stabilize the film structure and achieve better performance for the electronic device or have a passivation layer deposited thereover. For example, changes in film properties, such as mobility and carrier concentration, have been observed after several weeks of exposure to air for some zinc oxynitride films deposited at 50 degrees Celsius (note that the films have either not been annealed at a high temperature or do not have a passivation layer formed thereover).

Therefore, there is a need in the art for a method of fabricating a semiconductor layer for a TFT in which the device performance is not limited by the annealing and deposition temperatures.

SUMMARY OF THE INVENTION

Embodiments disclosed herein relate to a TFT and methods for manufacture thereof. Specifically, the embodiments herein relate to methods for forming a semiconductor layer at a low temperature for use in a TFT. The semiconductor layer may be formed by depositing a nitride layer or oxynitride layer, such as zinc nitride or oxynitride, and then converting the layer into a layer with a different oxygen content than before. The conversion occurs by exposing the nitride or oxynitride layer to air with high relative humidity up to 100 degrees Celsius or steam or a gas with water vapor at a temperature above 100 degrees Celsius; physically dipping the nitride or oxynitride layer into water; or heating the substrate to a temperature of between about 100 degrees Celsius and about 200 degrees Celsius while exposing the nitride layer to steam.

In one embodiment, a method for forming a semiconductive oxynitride compound comprises depositing a nitride layer on a substrate and exposing the nitride layer to a wet environment to convert the nitride layer to a semiconductive oxynitride layer.

In another embodiment, a method for forming a semiconductive oxynitride compound comprises depositing an oxynitride layer with low oxygen content on a substrate and exposing the oxynitride layer to a wet environment to convert the layer to a semiconductive oxynitride layer with high oxygen content. In another embodiment, a method for forming a semiconductive oxynitride compound comprises depositing an oxynitride layer with low oxygen content on a substrate and exposing the oxynitride layer to a wet environment to convert the top portion to the layer to a semiconductive oxynitride layer with high oxygen content.

In another embodiment, a method of fabricating a TFT, comprises forming a gate electrode over a substrate, depositing a gate dielectric layer over the gate electrode and the substrate and forming a semiconductor layer over the gate dielectric layer. The forming of the semiconductor layer comprises depositing a nitride layer over the gate dielectric layer and exposing the nitride layer to a wet atmosphere to convert the nitride layer into an oxynitride layer. The method additionally comprises forming source and drain electrodes over the semiconductor layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein relate to a TFT and methods for manufacture thereof. Specifically, the embodiments herein relate to methods for forming the semiconductor layer in a TFT at a low temperature. The semiconductor layer may be formed by depositing a nitride layer or oxynitride layer, such as zinc nitride or oxynitride, and then converting the layer into a layer with a different oxygen content than before. The conversion occurs by exposing the nitride or oxynitride layer to air with high relative humidity up to 100 degrees Celsius or steam or a gas with water vapor at a temperature above 100 degrees Celsius; physically dipping the nitride or oxynitride layer into water; or heating the substrate to a temperature of between about 100 degrees Celsius and about 200 degrees Celsius while exposing the nitride layer to steam.

Figure 1A:
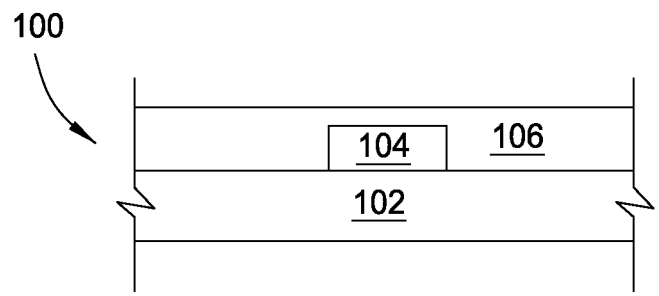
FIGS. 1A-1C are schematic cross-sectional views of a TFT 100 at various stages of production.
Figure 1B:
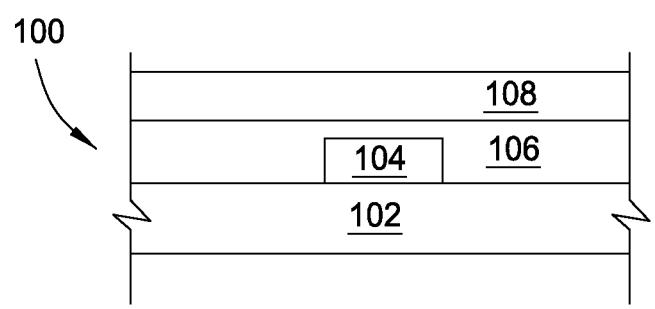
Figure 1C:
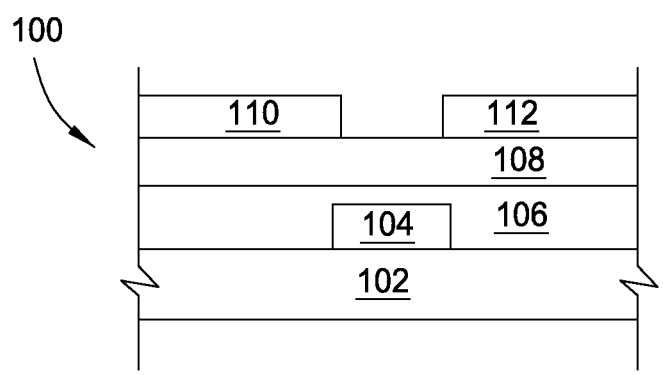

FIGS. 1A-1C are schematic cross-sectional views of a TFT 100 at various stages of production. As shown in FIG. 1A, a gate electrode 104 is formed over a substrate 102. Suitable materials that may be utilized for the substrate 102 include, but not limited to, silicon, germanium, silicon-germanium, soda lime glass, glass, semiconductor, plastic, steel or stainless steel substrates. Suitable materials that may be utilized for the gate electrode 104 include, but are not limited to, chromium, copper, aluminum, tantalum, titanium, molybdenum, and combinations thereof, or transparent conductive oxides (TCO) such as indium tin oxide (ITO) or fluorine doped zinc oxide (ZnO:F) which are commonly used as transparent electrodes. The gate electrode 104 may be deposited by suitable deposition techniques such as PVD, MOCVD, a spin-on process and printing processes. The gate electrode 104 may be patterned using an etching process.

Over the gate electrode 104, a gate dielectric layer 106 may be deposited. Suitable materials that may be used for the gate dielectric layer 106 include silicon dioxide, silicon oxynitride, silicon nitride, aluminum oxide or combinations thereof. The gate dielectric layer 106 may be deposited by suitable deposition techniques including plasma enhanced chemical vapor deposition (PECVD).

A semiconductor layer 108 is then formed over the gate dielectric layer 106 as shown in FIG. 1B. In practice, the semiconductor layer 108 is oftentimes referred to as the channel layer, the active layer or the semiconductor active layer. The semiconductor layer 108 may comprise an oxynitride, such as indium-gallium-zinc-oxynitride (IGZON) and zinc oxynitride (ZnON). Other oxynitrides that are contemplated include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned oxynitrides may be doped by a dopant such as Al, Sn, Ga, Ca, Si, Ti, Cu, Ge, In, Ni, Mn, Cr, V, Mg, $Si_xO_y$, $Si_xN_y$, $Al_xO_y$, and SiC. The semiconductor layer 108 permits the current to flow between the source and drain electrodes once the gate electrode 104 is biased. After deposition, the semiconductor layer 108 may be patterned, if desired, by a wet etching process.

The semiconductor layer 108 may be formed by depositing a nitride layer and then converting the nitride layer into an oxynitride layer. For example, to form a zinc oxynitride layer, zinc nitride ($Zn_3N_2$) may be deposited and then converted into zinc oxynitride. The zinc nitride layer may be deposited by a suitable deposition method such as PVD, PECVD, CVD, atomic layer deposition (ALD), a spin-on process or a printing process. In one embodiment, the zinc nitride layer is deposited by PVD. The deposition occurs at a low temperature such as below about 100 degrees Celsius.

Following deposition of the zinc nitride layer, the zinc nitride layer is converted to a zinc oxynitride layer. There are several embodiments for converting the zinc nitride layer into a zinc oxynitride layer. Each of the embodiments involves exposing the deposited nitride layer to a wet environment (i.e., exposing to $H_2O$ in liquid or vapor form such as air of 95 degrees Celsius and 95% relative humidity). One embodiment is using a hot environment whereby the deposited zinc nitride layer is exposed to air of 95 degrees Celsius and 95% relative humidity for 30 minutes. In another embodiment, the zinc nitride layer is physically dipped into water in a high pressure environment and at temperatures below 100 degrees Celsius (i.e., pressures of between about 1-2 atm). In another embodiment, the substrate may be heated to a temperature of about 150 degrees while the zinc nitride layer is exposed to steam. The maximum temperature for the exposure to the wet environment is 250 degrees Celsius, but it is contemplated that temperatures as low as 100 degrees Celsius may be utilized. In each of the embodiments, the zinc nitride layer is converted into a zinc oxynitride layer. It is to be understood that the embodiments are equally applicable to the situation where an oxynitride layer is deposited and then converted to an oxygen rich oxynitride layer.

It is to be understood that while the discussion herein relates to depositing a zinc nitride layer and converting the zinc nitride layer into a zinc oxynitride layer, other nitride layers are contemplated for conversion to an oxynitride layer. It is important to note that the mobility and the carrier concentration of the deposited nitride layer can be adjusted by doping the nitride layer with a dopant. Any doping would occur during the deposition of the nitride layer. For example, when forming aluminum doped zinc oxynitride by PVD, zinc and aluminum sputtering target is utilized. The zinc more readily reacts with the nitrogen as compared to the aluminum reacting with the nitrogen and thus aluminum doped zinc nitride is deposited. Additionally, the mobility and the carrier concentration of the nitride layer is a function of the metal used for the layer. For example, indium-gallium-zinc-nitride or zinc-tin-nitride each have different mobility and/or carrier concentrations as compared to zinc nitride. Additionally, while deposition of a nitride has been exemplified, it is contemplated that a metal oxynitride that is not completely oxidized or another convertible compound may be deposited so long as the deposited material can be easily converted to a metal oxide, a metal oxynitride or a different compound in the conversion step. Generally speaking, the initially deposited film should be weaker or less stable than the film to which the deposited film is converted. The conversion may occur in a reactive gas (i.e., an oxygen containing gas) atmosphere that is either in a plasma state or a non-plasma state. The conversion may even occur in a liquid that could have catalyst added thereto. The reaction rate to convert the deposited material can be controlled so that the reaction can take place in the base and deposited materials or just the base material or just a composite material. The converted film, due to the oxygen added to the compound, can be a degenerated semiconductor that is often known as a TCO or a semiconductor layer with a wide band gap and a Fermi level far away from the conduction band or the valance band that is often known as the insulation band.

Additionally, the nitride conversion process to oxynitride is not limited to converting a metal nitride into a metal oxynitride. By utilizing the embodiments discussed herein a silicon nitride layer can be completely converted to a silicon oxide layer such that no silicon nitride remains. The silicon nitride conversion may occur when the silicon nitride layer covers the semiconductor layer 108 comprises indium-gallium-zinc-oxide as a passivation layer. The conversion of silicon nitride film will change the interface between the passivation layer and semiconductor layer.

Each of the embodiments discussed herein refer to converting a nitride into an oxynitride compound. It is important to note that converting from an oxide compound to an oxynitride compound does not work by simply exposing the oxide to a nitrogen containing atmosphere. Oxygen is a much more aggressive reactant as compared to nitrogen. Thus, when a nitride is exposed to the oxygen atmosphere, the oxygen will react with the nitride to form an oxynitride. However, because the nitrogen is not as reactive as the oxygen, an oxide that is exposed to the nitrogen atmosphere will remain an oxide. At best, the nitrogen may dope the oxide film. Therefore, while converting a nitride to an oxynitride is possible at a low cost, converting from an oxide to an oxynitride is cost prohibitive.

Even with the benefit of utilizing a lower temperature for depositing and converting the nitride or oxynitride, it is contemplated that annealing may still be utilized if desired. Any annealing that occurs will improve the stability and possible mobility of the semiconductor layer 108 because annealing removes impurity trapped inside film or top the surface and stabilizes the semiconductor layer 108. It is to be noted that even without annealing, a converted oxynitride layer has a stability as an oxynitride layer that is formed directly and then annealed at a temperature of about 400 degrees Celsius for about 10 minutes. If annealing does occur, the annealing can occur before, after or both before and after the converting step to increase the mobility of the semiconductor layer 108. The annealing may occur at temperatures of between about 150 degrees Celsius and about 400 degrees Celsius in an atmosphere comprising $N_2O$, $N_2$, $O_2$ or combinations thereof.

The converted film, which is the semiconductor layer 108, is non-columnar (i.e., non-vertical) preferentially grown in the vertical direction and generally has the appearance of randomly stacked boulders when viewed on the microscopic level. The converted layer may even be graded such that more oxide is present near the top exposed surface and more nitride is present at the surface adjacent the gate dielectric layer 106 due to the oxygen transmission through the semiconductor layer 108. The converted layer may even be fabricated as a multilayered structure with different oxygen contents therethrough as discussed in U.S. Patent Application Publication No. 2010/0001272 A1.

As shown in FIG. 1C, over the semiconductor layer 108, the source electrode 110 and the drain electrode 112 are formed. The exposed portion of the semiconductor layer 108 between the source and drain electrodes 110, 112 is referred to as the active channel 114. Suitable materials for the source and drain electrodes 110, 112 include chromium, copper, aluminum, tantalum, titanium, molybdenum, and combinations thereof, or TCOs mentioned above. The source and drain electrodes 110, 112 may be formed by suitable deposition techniques, such as PVD followed by patterning through etching.

Converting a nitride into an oxynitride rather than simply depositing an oxynitride compound is more cost effective than depositing an oxynitride directly. For example, zinc nitride is simpler to deposit than zinc oxynitride. When forming zinc oxynitride directly, both a nitrogen containing gas and an oxygen containing gas are utilized, with a significantly greater amount of nitrogen containing gas as compared to oxygen containing gas (e.g., 5 to 10 times the amount of oxygen containing gas). However, if only a nitride layer is deposited, no oxygen containing gas is supplied, which can reduce the complexity, process development cycles, and costs. Additionally, heating the substrate to a temperature below about 250 degrees Celsius or exposing the nitride layer to steam in an environment of about 100 degrees Celsius is more cost effective than annealing a depositing oxynitride layer to a temperature of about 400 degrees Celsius. The resulting oxynitride film formed by converting has similar or unique film properties compared to an oxynitride film formed directly and annealed at a temperature of about 400 degrees Celsius for a period of about 10 minutes and is just as stable a film. Thus, the temperature of depositing the semiconductor layer and the temperature of annealing the semiconductor layer does not limit the TFT performance.

It is to be understood that the invention is applicable not just to depositing a nitride layer and converting the nitride layer into an oxynitride layer. It is also contemplated that the oxynitride layer can be formed directly and then converted into an oxygen rich oxynitride layer. Additionally, the resulting structure for any conversion can be a multi-layer semiconductor layer. For example, if zinc nitride is deposited and then converted, the resulting multilayer structure can include zinc nitride at the interface with the gate dielectric layer and zinc oxynitride at the interface with the source and drain electrodes. Similarly, if zinc oxynitride is deposited and then converted, the resulting multilayer structure can include zinc oxynitride at the interface with the gate dielectric layer and oxygen rich zinc oxynitride (i.e., greater oxygen content as compared to the zinc oxynitride at the interface with the gate dielectric layer) at the interface with the source and drain electrodes. Similarly, if zinc oxynitride is deposited and then converted, the resulting multilayer structure can include zinc oxynitride at the interface with the gate dielectric layer and zinc oxide (i.e., the oxynitride has completely converted to an oxide) at the interface with the source and drain electrodes. Because there is more oxygen at the interface between the semiconductor layer and the source and drain electrode as compared to the interface between the semiconductor layer and the gate dielectric layer, the off-current is lowered for the TFT because the electrons flow through the back channel rather than adjacent the gate.

While the foregoing is directed to embodiments of the present invention, other and further embodiments of the invention may be devised without departing from the basic scope thereof, and the scope thereof is determined by the claims that follow.

The invention claimed is:

1. A method of fabricating a thin film transistor, comprising:
   forming a gate electrode over a substrate;
   depositing a gate dielectric layer over the gate electrode and the substrate;
   forming a semiconductive layer over the gate dielectric layer, the forming comprising:
      depositing a nitride layer over the gate dielectric layer; and
      exposing the nitride layer to a wet atmosphere to convert the nitride layer into an oxynitride layer; and
   forming source and drain electrodes over the semiconductive layer.

2. A method of fabricating a thin film transistor, comprising:
   forming a gate electrode over a substrate;
   depositing a gate dielectric layer over the gate electrode and the substrate;
   forming a semiconductive layer over the gate dielectric layer, the forming comprising:
      depositing an oxynitride layer over the gate dielectric layer; and
      exposing the oxynitride layer to a wet atmosphere to increase the oxygen content of the oxynitride layer; and
   forming source and drain electrodes over the semi conductive layer.

3. The method of claim 1, wherein the exposing comprises exposing the nitride layer to steam or water at a temperature of about 95 degrees Celsius in an atmosphere of 95 percent relative humidity for about 30 minutes.

4. The method of claim 1, wherein the exposing comprises dipping the nitride layer into water in an environment having a pressure of between about 1 and 2 atm and a temperature of less than 100 degrees Celsius.

5. The method of claim 1, wherein the exposing comprises heating the substrate to a temperature of about 100 degrees to about 250 degrees while exposing the nitride layer to steam.

6. The method of claim 1, wherein the nitride layer comprises $Zn_3N_2$.

7. The method of claim 1, wherein the oxynitride layer is non-columnar.

8. The method of claim 1, wherein the oxynitride layer is graded in composition after the exposing such that a greater amount of oxygen is present in the oxynitride layer at one surface relative to ru1otber surface of the oxynitride layer.

9. The method of claim 1, wherein the wet atmosphere comprises water vapor.

10. The method of claim 1, further comprising annealing the oxynitride layer at a temperature between about 350 degrees Celsius and about 400 degrees Celsius in an atmosphere comprising $N_2O$, $N_2$, $0_2$ or combinations thereof.

11. The method of claim 1, wherein the nitride layer comprises one or more elements selected from the group consisting of zinc, tin, indium, gallium, cadmium and combinations thereof.

12. The method of claim 2, wherein the exposing comprises exposing the oxynitride layer to steam or water at a temperature of about 95 degrees Celsius in an atmosphere of 95 percent relative humidity for about 30 minutes.

13. The method of claim 2, wherein the exposing comprises dipping the oxynitride layer into water in an environment having a pressure of between about I and 2 atm and a temperature of less than 100 degrees Celsius.

14. The method of claim 2, wherein the exposing comprises heating the substrate to a temperature of about 100 degrees to about 250 degrees while exposing the nitride layer to steam.

15. The method of claim 2, wherein the oxynitride layer is graded in composition after the exposing such that a greater amount of oxygen is present in the oxynitride layer at one surface relative to another surface of the oxynitride layer.

16. The method of claim 2, further comprising annealing the oxynitride layer at a temperature between about 350 degrees Celsius and about 400 degrees Celsius in an atmosphere comprising $N_2O$, $N_2$, $0_2$ or combinations thereof.

17. The method of claim 2, wherein the oxynitride layer comprises one or more elements selected from the group consisting of zinc, tin, indium, gallium, cadmium and combinations thereof.

* * * * *